(12) United States Patent
Tomita

(10) Patent No.: US 8,027,220 B2
(45) Date of Patent: Sep. 27, 2011

(54) OSCILLATION DEVICE, METHOD OF OSCILLATION, AND MEMORY DEVICE

(75) Inventor: Hiroyoshi Tomita, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 491 days.

(21) Appl. No.: 12/147,061

(22) Filed: Jun. 26, 2008

(65) Prior Publication Data
US 2009/0016136 A1    Jan. 15, 2009

(30) Foreign Application Priority Data
Jul. 10, 2007    (JP) ................. 2007-181366

(51) Int. Cl.
*G11C 8/00* (2006.01)
(52) U.S. Cl. ................. 365/233.1; 365/233.12
(58) Field of Classification Search ............... 365/233.1, 365/233.12, 222; 327/39, 156
See application file for complete search history.

(56) References Cited

U.S. PATENT DOCUMENTS

| 7,242,223 | B1 * | 7/2007 | Alon ........................ 327/39 |
| 2003/0227307 | A1 * | 12/2003 | Le et al. ................. 327/156 |
| 2006/0023545 | A1 | 2/2006 | Ito et al. |
| 2006/0146628 | A1 | 7/2006 | Cho |

FOREIGN PATENT DOCUMENTS

| JP | 2001-184860 A | 7/2001 |
| JP | 2006-004557 A | 1/2006 |

\* cited by examiner

*Primary Examiner* — Vu A Le
(74) *Attorney, Agent, or Firm* — Arent Fox LLP

(57) ABSTRACT

An oscillation device includes a first setting unit that outputs an oscillation period designation signal, a calculating unit that performs an arithmetic operation on the oscillation period designation signal, and an oscillating unit that generates an oscillation signal having a period based on the oscillation period designation signal subjected to the arithmetic operation.

17 Claims, 14 Drawing Sheets period of the oscillation signal period of the oscillation signal

OSCILLATION DEVICE, METHOD OF OSCILLATION, AND MEMORY DEVICE

CROSS-REFERENCE TO RELATED APPLICATIONS

This application is based upon and claims the benefit of priority from the prior Japanese Patent Application No. 2007-181366, filed on Jul. 10, 2007, the entire contents of which are incorporated herein by reference.

TECHNICAL FIELD

This is related to an oscillation device, a method of oscillation, and a memory device.

BACKGROUND

A memory includes an oscillator for generating a self-refresh request signal. Unfortunately, the oscillator has a variation in oscillation period due to process variations. Disadvantageously, required refresh time varies from semiconductor chip to another. To overcome the disadvantage, the frequency division number for a refresh request signal is changed in each semiconductor chip in a probing test. Accordingly, the period of the refresh request signal is adjusted to reduce a variation in required period of the refresh request signal between semiconductor chips.

The memory includes normal memory cells and redundant memory cells. A problem which arises in this case is the relation between a first probing test before replacing a normal memory cell with a redundant memory cell (hereinafter, "before redundancy") and a second probing test after replacing a normal memory cell with a redundancy memory cell (hereinafter, "after redundancy"). In the first probing test before redundancy, it is necessary to set the period of the refresh request signal before redundancy to be longer than that after redundancy in order to prevent a failure that is caused by an insufficient refresh operation in the second probing test after redundancy. However, it is difficult to set the period of the refresh request signal before redundancy to be longer than that after redundancy using an appropriate margin for each semiconductor chip, since it is impossible to get the frequency division number, which differs from semiconductor chip to another, from outside.

Japanese Laid-open Patent Publication No. 2001-184860 discloses a semiconductor memory device having a self-refresh mode. The semiconductor memory device includes self-refresh term varying means that receives a predetermined external address signal, generates an oscillation period control signal on the basis of the predetermined external address signal, and varies the oscillation period of an oscillation circuit in accordance with the oscillation period control signal to vary the self-refresh term.

Japanese Laid-open Patent Publication No. 2006-4557 discloses a semiconductor memory device including the following elements. A memory array includes a plurality of memory cells each of which needs a refresh operation in order to hold data. A first control circuit writes predetermined data into predetermined memory cells (referred to as monitor cells) in the memory array. A second control circuit reads data from the monitor cells, in which the predetermined data has been written, after a lapse of time equal to a refresh period or a lapse of predetermined time shorter than the refresh period. A third control circuit compares the data read from the monitor cells with the predetermined data to measure an error count or error rate and variably controls the refresh period on the basis of the measured error count or error rate.

SUMMARY

According to one aspect of the embodiments, an oscillation device is provided. The oscillation device includes a first setting unit, a calculating unit, and an oscillating unit. A first setting unit outputs an oscillation period designation signal. A calculating unit performs an arithmetic operation on the oscillation period designation signal. An oscillating unit generates an oscillation signal having a period based on the oscillation period designation signal subjected to the arithmetic operation.

DESCRIPTION OF THE PREFERRED EMBODIMENTS

Figure 12:
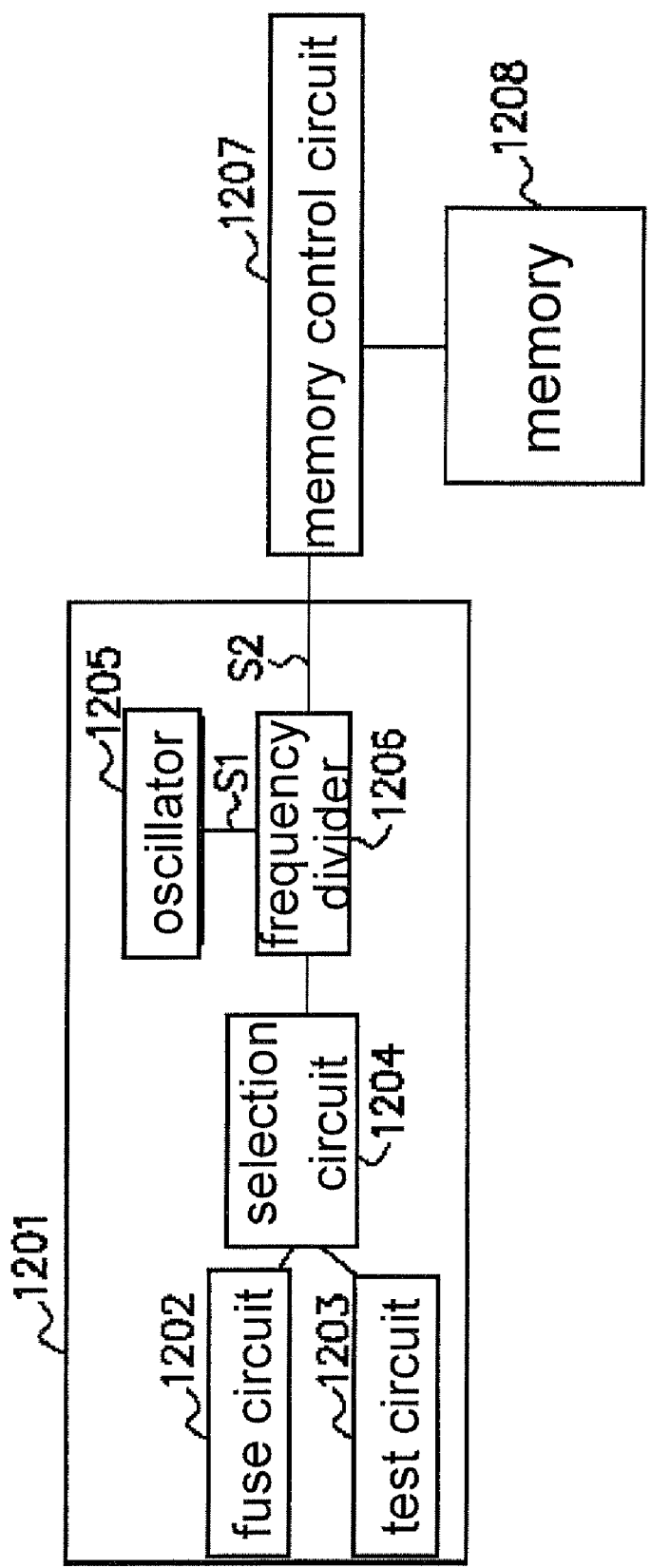
FIG. 12 is a diagram illustrating the structure of a memory device.

FIG. 12 is a diagram illustrating the structure of a memory device. An oscillation device 1201 generates a refresh request signal S2. In a measurement mode, a test circuit 1203 designates a frequency division number and outputs data indicating the designated frequency division number to a frequency divider 1206 through a selection circuit 104. An oscillator 1205 outputs an oscillation signal S1. The frequency divider 1206 divides the frequency of the oscillation signal S1 at the designated frequency division number to output the refresh request signal S2. The period of the refresh request signal S2 is measured and a frequency division number for correcting a variation in the measured period is written into a fuse circuit 1202. In a normal mode, the fuse circuit 1202 outputs data indicating the written frequency division number to the frequency divider 1206 through the selection circuit 1204. Consequently, the oscillation device 1201 can generate the refresh request signal S2 having a desired period. A memory 1208 stores data. A memory control circuit 1207 performs a refresh operation on the memory 1208 in response to the refresh request signal S2.

It is necessary that the setting of the frequency division number in the fuse circuit 1202 can be reproduced in a test mode. Furthermore, it is necessary to make a test while the frequency division number before redundancy is set so as to have a margin as compared to the frequency division number after redundancy (set in the fuse circuit 1202).

Figure 13:
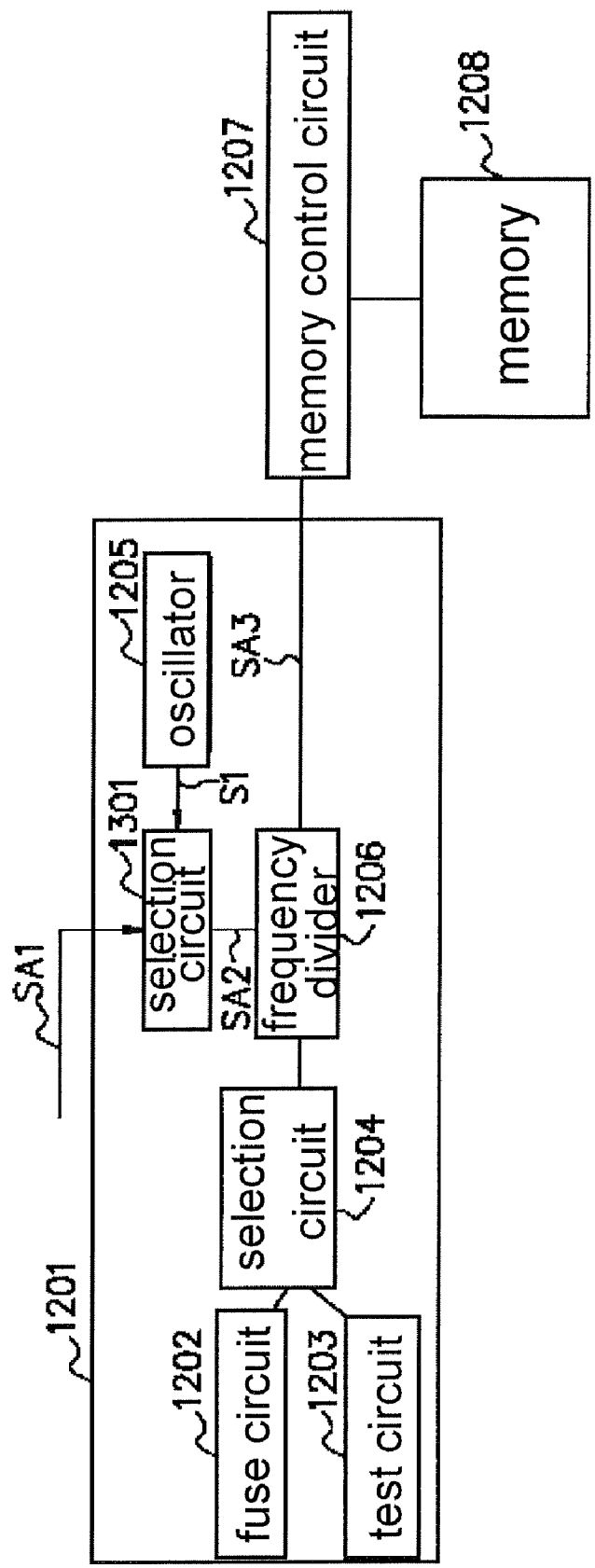
FIG. 13 is a diagram illustrating the structure of a memory device for allowing a frequency division number to have a margin in a test mode before redundancy.

FIG. 13 is a diagram illustrating the structure of a memory device for providing a margin for a frequency division number in the test mode before redundancy. The difference between the structures in FIGS. 12 and 13 will now be described. A selection circuit 1301 selects an externally supplied oscillation signal SA1 in the test mode before redundancy and outputs the selected signal as an oscillation signal SA2. In the test mode after redundancy, the selection circuit 1301 selects the oscillation signal S1 output from the oscillator 1205 and outputs the selected signal as the oscillation signal SA2. The frequency divider 1206 divides the frequency of the oscillation signal SA2 to output a refresh request signal SA3. The memory control circuit 1207 performs the refresh operation on the memory 1208 in response to the refresh request signal SA3.

Figure 14:
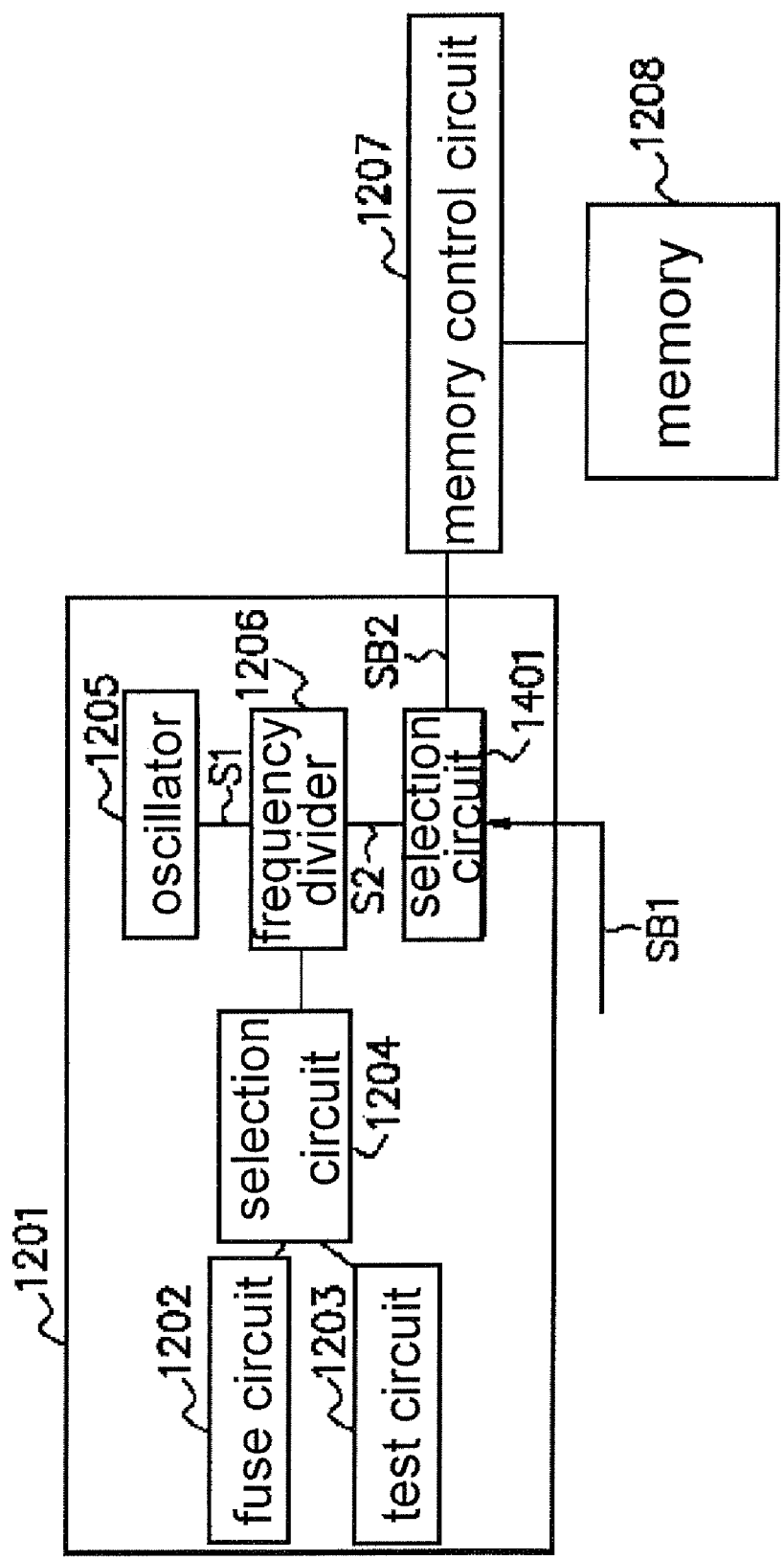
FIG. 14 is a diagram illustrating the structure of another memory device for allowing a frequency division number to have a margin in the test mode before redundancy.

FIG. 14 is a diagram illustrating the structure of another memory device for providing a margin for a frequency division number in the test mode before redundancy. The difference between the structures in FIGS. 12 and 14 will now be described. A selection circuit 1401 selects an externally supplied refresh request signal SB1 in the test mode before redundancy and outputs the selected signal as a refresh request signal SB2. In the test mode after redundancy, the selection circuit 1401 selects the refresh request signal S2 output from the frequency divider 1206 and outputs the selected signal as the refresh request signal SB2. The memory control circuit 1207 performs the refresh operation on the memory 1208 in response to the refresh request signal SB2.

Figure 1:
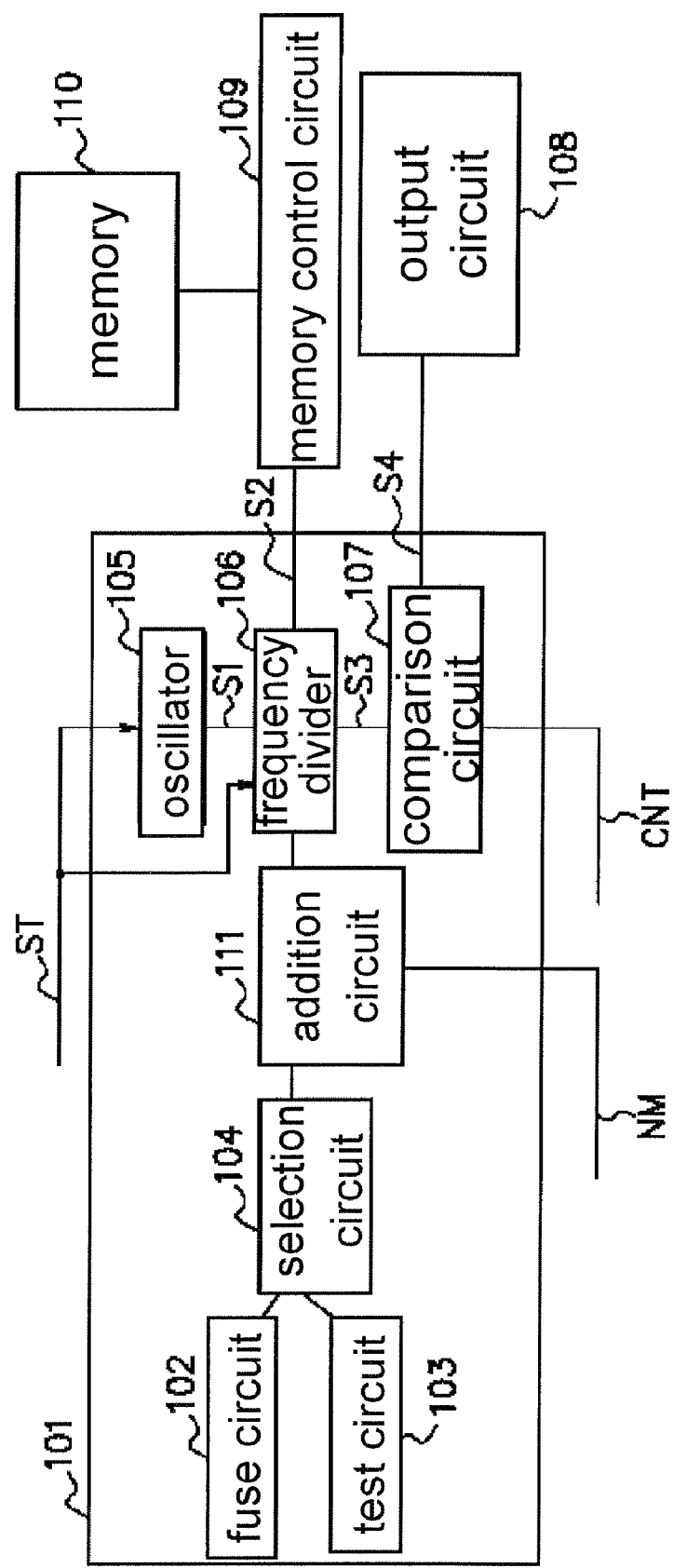
FIG. 1 is a block diagram illustrating the structure of a memory device according to a first embodiment.
Figure 2:
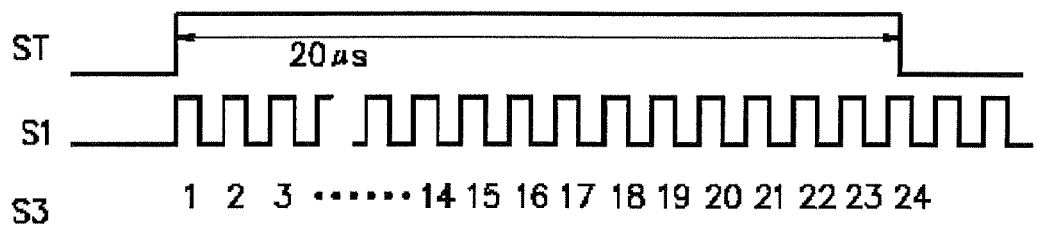
FIG. 2 is a timing diagram explaining an operation of the memory device.

FIG. 1 is a block diagram illustrating the structure of a memory device according to a first embodiment. FIG. 2 is a timing diagram explaining an operation of the memory device. An oscillation device 101 includes a fuse circuit 102, a test circuit 103, a selection circuit 104, an oscillator 105, a frequency divider 106, a comparison circuit 107, and an addition circuit 111. The oscillation device 101 generates a refresh request signal S2. The oscillation device 101 has a measurement mode, a test mode, and a normal mode. A method of oscillation of the oscillation device 101 will now be described. First, a method of adjusting the period of the refresh request signal S2 in the measurement mode will be described. The test circuit 103 outputs data indicating a frequency division number in the measurement mode. For example, the frequency division number output by the test circuit 103 can be externally controlled. In the measurement mode, the selection circuit 104 selects the frequency division number output from the test circuit 103. The fuse circuit 102, the test circuit 103, and the selection circuit 104 constitute a setting unit for setting a frequency division number for the frequency divider 106. In the measurement mode, the addition circuit 111 does not perform addition or adds zero. The oscillator 105 and the frequency divider 106 constitute an oscillating unit. The oscillator 105 generates an oscillation signal S1 in response to an enable signal ST. Specifically, the oscillator 105 generates an oscillation signal and starts to output the oscillation signal S1 when the enable signal ST goes to a high level. The frequency divider (first frequency divider) 106 includes a counter. The frequency divider 106 divides the frequency of the oscillation signal S1 by the frequency division number output from the selection circuit 104 to output the refresh request signal (first frequency division signal) S2. In addition, the frequency divider 106 counts the number of pulses output as the oscillation signals S1 (hereinafter, the oscillation number of the oscillation signal S1) and outputs a count value S3. Furthermore, when the enable signal ST goes to the high level, the frequency divider 106 resets the count value S3 to zero. When the enable signal ST goes to a low level, the frequency divider 106 stops counting and holds the count value S3. When the enable signal ST goes to the low level, the oscillator 105 may stop outputting the oscillation signal S1.

A period (hereinafter, high-level period) during which the enable signal ST is at the high level is, for example, 20 µs. The high-level period can be changed. While the enable signal ST is at the high level, the frequency divider 106 counts the oscillation signal S1 to obtain the count value S3. For example, the count value S3 is 24 for a period of 20 µs during which the enable signal ST is at the high level. The frequency divider 106 (or the counter therein) can select either of resetting with the frequency division number (the oscillation number designated by a first signal from an addition circuit 111) designated by the test circuit 103 and non-resetting. In the measurement mode, non-resetting is selected. In the test mode and the normal mode, resetting is selected. The test circuit 103 may output a frequency division number greater than 24. The period of the oscillation signal S1 is expressed as a value obtained by dividing the high-level period (20 µs) of the enable signal ST by the count value S3.

When the oscillation number ranges from 24 to 25, the counter value S3 is 24. Unfortunately, an error occurs because the count value S3 is an integer. The period of the oscillation signal S1 ranges from 20 µs/24 to 20 µs/25. In this case, a maximum error in the period of the oscillation signal S1 is expressed as 20 µs/24−20µ/25=20 µs/(24×25).

This error can be reduced by extending the high-level period of the enable signal ST. For example, when the high-level period of the enable signal ST is set to 200 µs, the count value S3 is approximately 240 and the maximum error in the period of the oscillation signal S1 is expressed as 200 µs/240−200 µs/241=200 µs/(240×241). Thus, the maximum error can be an order of magnitude less than that in the case where the high-level period is 20 µs. Consequently, the period of the oscillation signal S1 can be measured with high accuracy in a single measurement.

The comparison circuit (comparator) 107 compares the count value S3 with a reference value CNT and outputs a comparison result signal S4. When the count value S3 agrees with the reference value CNT, the comparison result signal S4 indicates agreement, i.e., serves as an agreement signal. When the count value S3 disagrees with the reference value CNT, the comparison result signal S4 indicates disagreement, i.e., serves as a disagreement signal. An external signal indicative of the reference value CNT can be externally supplied as an address signal via, for example, an address line. An output circuit 108, functioning as an output buffer, outputs the comparison result signal S4 to the outside. The reference value CNT is changed, thus detecting the reference value CNT at which the comparison result signal S4 indicates agreement. The reference value CNT at which the comparison result signal S4 indicates agreement is detected as the oscillation number of the oscillation signal S1, i.e., the count value.

To detect the count value S3 using an external address as the reference value CNT, the counter in the frequency divider 106 is constructed as a binary counter. In this case, since the count value S3 is 24=11000 (in binary notation), the count value S3 can be detected by comparing the count value S3 with addresses A10 to A0 (=LLL, LLLH, HLLL). In this instance, L (low level) indicates "0" and H (high level) indicates "1".

Figure 3:
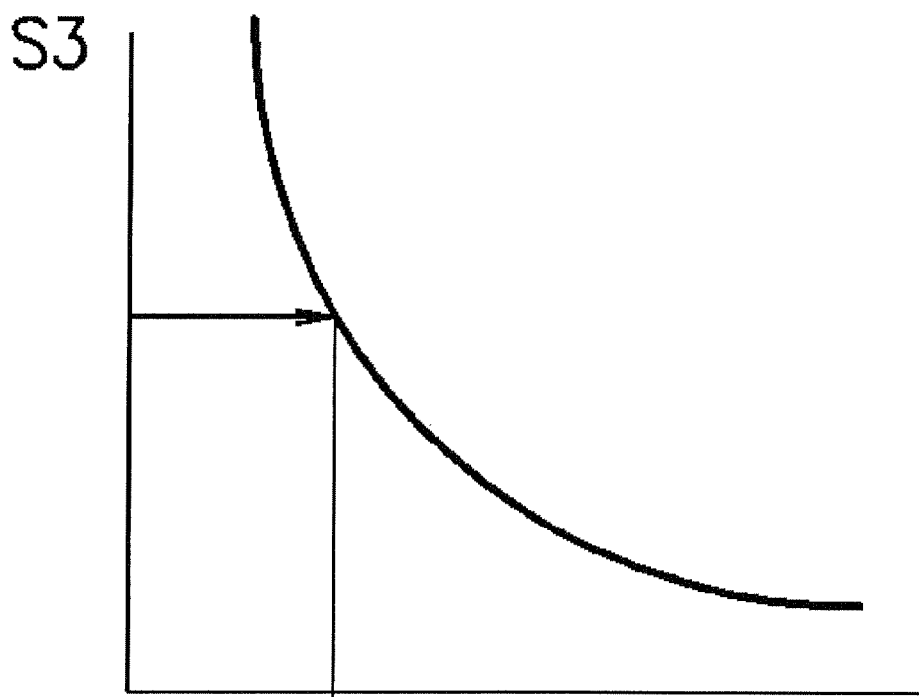
FIG. 3 includes graphs explaining a method of setting a frequency division number in a fuse circuit on the basis of a count value obtained by a frequency divider.
Figure 3:
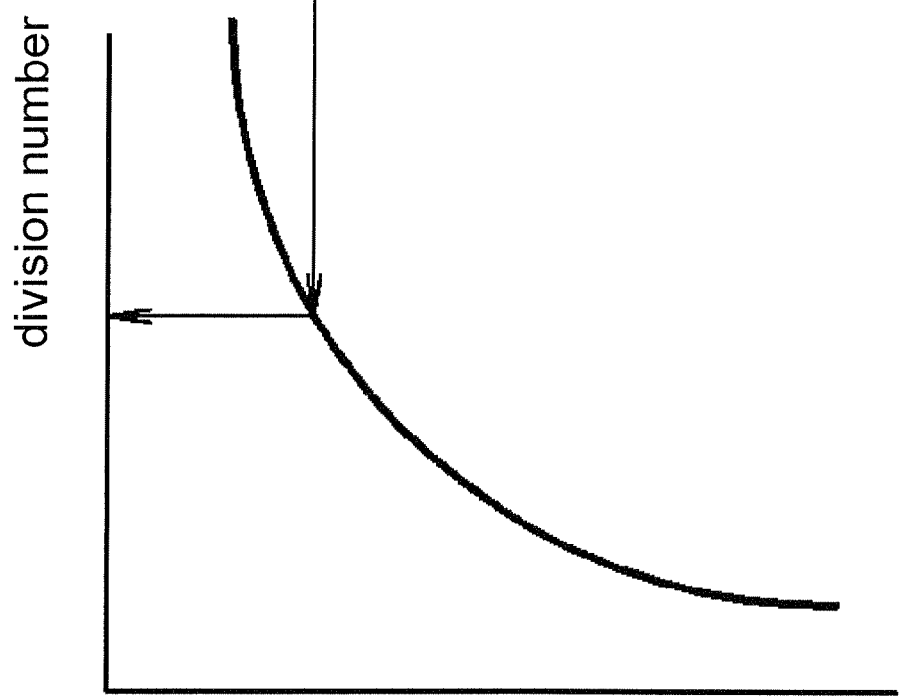

FIG. 3 shows graphs explaining a method of setting a frequency division number to be written into the fuse circuit 102 on the basis of the count value S3 counted by the frequency divider 106. As described above, the count value S3 of the frequency divider 106 can be detected. Referring to the upper graph in FIG. 3, the high-level period of the enable signal ST is divided by the count value S3, thus obtaining the oscillation period of the oscillation signal S1. Subsequently, as shown in the lower graph in FIG. 3, a desired period of the refresh request signal S2 is divided by the oscillation period of the oscillation signal S1, thereby obtaining a frequency division number. The obtained frequency division number is written into the fuse circuit 102. The fuse circuit 102, including a laser fuse circuit or an electrical fuse circuit, stores the frequency division number.

Actually, a table showing the relation between the count value S3 of the frequency divider 106 and the frequency division number is prepared. A frequency division number is obtained on the basis of the count value S3 of the frequency divider 106 using the table. The frequency division number is set in the fuse circuit 102 by fuse blowing.

A method of generating the refresh request signal S2 in the normal mode will now be described. The fuse circuit 102 outputs data indicating the written frequency division number. In the normal mode, the selection circuit 104 selects the frequency division number output from the fuse circuit 102. In the normal mode, the addition circuit 111 does not perform addition or adds zero. The oscillator 105 generates the oscillation signal S1 in response to the enable signal ST. The frequency divider 106 divides the frequency of the oscillation signal S1 by the frequency division number output from the selection circuit 104 to generate the refresh request signal S2. Consequently, the refresh request signal S2 having a desired period can be generated and a variation in the period of the refresh request signal S2 can be prevented.

A memory 110, such as a DRAM or a pseudo SRAM that requires a refresh operation, stores data. A memory control circuit (memory controller) 109 performs the refresh operation on the memory 110 in response to the refresh request signal S2. The refresh operation is an operation for restoring charge so that data stored in the DRAM is not lost. The DRAM, serving as a type of semiconductor memory, holds information by storing charge in capacitors. The charge tends to decrease with time. Accordingly, when being left for a predetermined period of time, the DRAM is completely discharged and information stored in the DRAM is lost. To prevent the loss of information, the DRAM requires the refresh operation for restoring charge at regular intervals.

The memory 110 has a plurality of normal memory cells and a plurality of redundant memory cells. The normal and redundant memory cells each serve as a memory cell for storing data. Tests are performed in the test mode between the measurement mode and the normal mode.

A first probing test is performed. The first probing test is to be made on a memory device before redundancy (i.e., before a normal memory cell is replaced with a redundant memory cell). Normal memory cells and redundant memory cells are subjected to a refresh operation test. In this test, a failed normal memory cell is replaced with a passed redundant memory cell. The above-described writing operation on the fuse circuit 102 may be performed after the first probing test.

Subsequently, a second probing test is performed. The second probing test is to be made on a memory device after redundancy (i.e., after a normal memory cell is replaced with a redundant memory cell). The normal memory cells and a replaced redundant memory cell are subjected to the refresh operation test. The first and second probing tests are to be made on a memory device including a semiconductor chip before packaging.

After that, a final test is performed. The final test is to be made on a memory device after packaging. The normal memory cells and a replaced redundant memory cell are subjected to the refresh operation test.

In the test mode for the final test, the refresh operation test is performed using the refresh request signal S2 having the same period as that in the normal mode. For example, in the final test mode and the normal mode, the frequency division number of the frequency divider 106 is 20 and the period of the refresh request signal S2 is 420 µs. The frequency division number "20" is written in the fuse circuit 102 in the above-described measurement mode. Since the selection circuit 104 selects the frequency division number written in the fuse circuit 102 and the addition circuit 111 does not perform addition, the frequency divider 106 performs frequency division using the frequency division number written in the fuse circuit 102.

In the test mode for the second probing test before the final test, the refresh operation test is performed under severer conditions than those in the final test. If the second probing test is performed under the same conditions as those in the final test, a memory cell that has narrowly passed in the second probing test may fail in the final test due to variations in refresh operation tests. To avoid such inefficient tests, the refresh operation test as the second probing test is performed under severer conditions than those in the final test. Specifically, the period of the refresh request signal S2 in the second probing test is set to be longer than that in the final test. The longer the period of the refresh request signal S2, the longer the refresh period, thus increasing the possibility of data loss. For example, in the second probing test, the frequency division number of the frequency divider 106 is 21 and the period of the refresh request signal S2 is 450 µs. The fuse circuit 102 stores the frequency division number of "20" and the selection circuit 104 selects the frequency division number stored in the fuse circuit 102. The addition circuit 111 adds a calculation factor NM (e.g., "1") to the frequency division number (e.g., "20") stored in the fuse circuit 102 and outputs the resultant frequency division number to the frequency divider 106. The addition circuit 111 substantially performs subtraction. The frequency divider 106 performs frequency division using the frequency division number (e.g., "21") output from the addition circuit 111 and outputs the refresh request signal S2 (having a period of, for example, 450 µs).

In the test mode for the first probing test before the second probing test, the refresh operation test is performed under severer conditions than those in the second probing test for the same reason as that described above. Specifically, the period of the refresh request signal S2 in the first probing test is set to be longer than that in the second probing test. For example, the frequency division number of the frequency divider 106 is 22 and the period of the refresh request signal S2 is 500 µs in the first probing test. The fuse circuit 102 stores the frequency division number of "20" and the selection circuit 104 selects the frequency division number stored in the fuse circuit 102. The addition circuit 111 adds the calculation factor NM (e.g., "2") to the frequency division number (e.g., "20") in the fuse circuit 102 and outputs the resultant frequency division number to the frequency divider 106. The frequency divider 106 performs frequency division using the frequency division number (e.g., "22") output from the addition circuit 111 and outputs the refresh request signal S2 (having a period of, for example, 500 μs).

The addition circuit 111 calculates so that the period of the refresh request signal S2 before redundancy is longer than that after redundancy.

As described above, according to the present embodiment, the period of the oscillation signal S1 can be measured with high accuracy in a single measurement. Advantageously, a variation in the period of the refresh request signal S2 can be easily prevented.

Since the period of the oscillation signal S1 generated by the oscillator 105 varies due to process variations, the frequency division number stored in the fuse circuit 102 differs from semiconductor chip of a memory device to another. In the first and second probing tests, the addition circuit 111 adds the calculation factor NM, as an appropriate margin, to the frequency division number stored in the fuse circuit 102. Consequently, even when the frequency division number stored in the fuse circuit 102 differs from semiconductor chip to another, the appropriate margin can be set in the frequency division number stored in the fuse circuit 102 in each semiconductor chip. Advantageously, the first and second probing tests can be appropriately performed.

Figure 4:
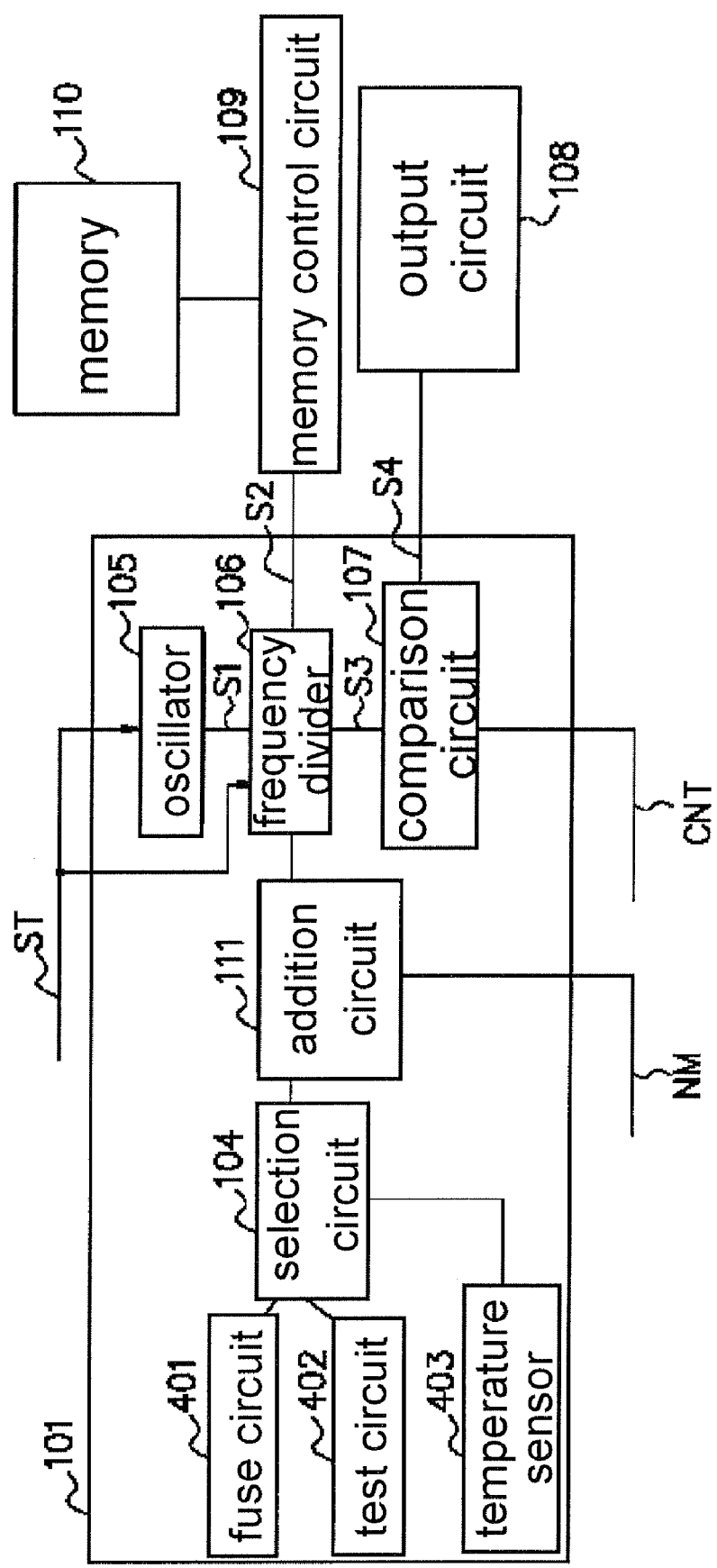
FIG. 4 is a block diagram illustrating the structure of a memory device according to a second embodiment.

FIG. 4 is a block diagram illustrating the structure of a memory device according to a second embodiment. The memory device according to the present embodiment (shown in FIG. 4) is obtained by further providing a high-temperature setting unit 401, a low-temperature setting unit 402, and a temperature sensor 403 for the memory device according to the first embodiment (shown in FIG. 1). The difference between the present embodiment and the first embodiment will now be described. It is preferred that the period of the refresh request signal S2 be changed depending on temperature. Since the discharge rate of stored charge in the memory 110 is high at high temperature, it is preferred that the frequency division number be set to a low value in order to reduce the period of the refresh request signal S2. Since the discharge rate of stored charge in the memory 110 is low at low temperature, it is preferred that the frequency division number be set to a high value in order to extend the period of the refresh request signal S2. Consequently, the power consumption can be reduced. The low frequency division number at high temperature is stored into the high-temperature setting unit 401. The high frequency division number at low temperature is stored into the low-temperature setting unit 402. The high-temperature setting unit 401 and the low-temperature setting unit 402 each include the fuse circuit 102 and the test circuit 103 shown in FIG. 1. The temperature sensor 403 detects a temperature. When the temperature detected by the temperature sensor 403 is higher than a threshold, the selection circuit 104 selects the frequency division number output from the high-temperature setting unit 401. When the temperature detected by the temperature sensor 403 is lower than the threshold, the selection circuit 104 selects the frequency division number output from the low-temperature setting unit 402. The high-temperature setting unit 401, the low-temperature setting unit 402, and the selection circuit 104 constitute a setting unit for setting a frequency division number for the frequency divider 106 according to a temperature detected by the temperature sensor 403.

First, at a high temperature (first temperature), the operation in the measurement mode according to the first embodiment is performed to detect the count value S3 with respect to the oscillation signal S1. Subsequently, a frequency division number at the high temperature is obtained on the basis of the count value S3 as explained with reference to FIG. 3. In this instance, the period of the refresh request signal S2 at the high temperature is short. After that, the frequency division number is written into the fuse circuit 102 in the high-temperature setting unit 401.

Subsequently, at a low temperature (second temperature), the operation in the measurement mode according to the first embodiment is performed to detect the count value S3 with respect to the oscillation signal S1. A frequency division number at the low temperature is obtained on the basis of the count value S3 as described with reference to FIG. 3. In this case, the period of the refresh request signal S2 at the low temperature is long. After that, the frequency division number is written into the fuse circuit 102 in the low-temperature setting unit 402.

In the above description, both of the frequency division number at the high temperature and that at the low temperature have been measured. Only either of them may be measured. For example, only the frequency division number at the high temperature may be measured. The frequency division number at the low temperature may be obtained by multiplying the frequency division number at the high temperature by a factor and the obtained value may be stored into the low-temperature setting unit 402. In the above description, two temperature ranges, i.e., high and low temperature ranges are provided and the frequency division number is set in each temperature range. The frequency division number may be set in each of three or more temperature ranges.

The test mode will now be described. The test mode in the second embodiment is the same as that in the first embodiment. In the test mode for the first probing test, when the temperature detected by the temperature sensor 403 is higher than the threshold, the selection circuit 104 selects the frequency division number output from the fuse circuit 102 in the high-temperature setting unit 401. When the temperature detected by the temperature sensor 403 is lower than the threshold, the selection circuit 104 selects the frequency division number output from the fuse circuit 102 in the low-temperature setting unit 402. The addition circuit 111 adds the calculation factor NM (e.g., "2") to the frequency division number (e.g., "20") output from the selection circuit 104. The frequency divider 106 divides the frequency of the oscillation signal S1 by the frequency division number (e.g., "22") output from the addition circuit 111 and outputs the refresh request signal S2 (having a period of, for example, 500 μs).

In the test mode for the second probing test, when the temperature detected by the temperature sensor 403 is higher than the threshold, the selection circuit 104 selects the frequency division number output from the fuse circuit 102 in the high-temperature setting unit 401. When the temperature detected by the temperature sensor 403 is lower than the threshold, the selection circuit 104 selects the frequency division number output from the fuse circuit 102 in the low-temperature setting unit 402. The addition circuit 111 adds the calculation factor NM (e.g., "1") to the frequency division number (e.g., "20") output from the selection circuit 104. The frequency divider 106 divides the frequency of the oscillation signal S1 by the frequency division number (e.g., "21") output from the addition circuit 111 and outputs the refresh request signal S2 (having a period of, for example, 450 μs).

In the test mode for the final test, when the temperature detected by the temperature sensor 403 is higher than the threshold, the selection circuit 104 selects the frequency division number output from the fuse circuit 102 in the high-temperature setting unit 401. When the temperature detected by the temperature sensor 403 is lower than the threshold, the selection circuit 104 selects the frequency division number output from the fuse circuit 102 in the low-temperature setting unit 402. The addition circuit 111 does not perform addition, or adds zero. The frequency divider 106 divides the frequency of the oscillation signal S1 by the frequency division number (e.g., "20") output from the selection circuit 104 and outputs the refresh request signal S2 (having a period of, for example, 420 µs).

In the normal mode, the oscillation device 101 generates the refresh request signal S2 in the same way as the first embodiment. When the temperature detected by the temperature sensor 403 is higher than the threshold, the selection circuit 104 selects the frequency division number output from the fuse circuit 102 in the high-temperature setting unit 401. When the temperature detected by the temperature sensor 403 is lower than the threshold, the selection circuit 104 selects the frequency division number output from the fuse circuit 102 in the low-temperature setting unit 402. The addition circuit 111 does not perform addition, or adds zero. The frequency divider 106 divides the frequency of the oscillation signal S1 by the frequency division number (e.g., "20") output from the selection circuit 104 and outputs the refresh request signal S2 (having a period of, for example, 420 µs).

According to the present embodiment, the period of the oscillation signal S1 can be measured with high accuracy in a single measurement in a manner similar to the first embodiment. Advantageously, a variation in the period of the refresh request signal S2 can be easily prevented.

Since the period of the oscillation signal S1 generated by the oscillator 105 varies due to process variations, the frequency division number stored in each fuse circuit 102 differs from semiconductor chip of a memory device to another. In the first and second probing tests, the addition circuit 111 adds the calculation factor NM, as an appropriate margin, to the frequency division number stored in the fuse circuit 102. Consequently, even when the frequency division number stored in the fuse circuit 102 differs from semiconductor chip to another, the appropriate margin can be set in the frequency division number stored in the fuse circuit 102 in each semiconductor chip. Advantageously, the first and second probing tests can be appropriately performed.

Figure 5:
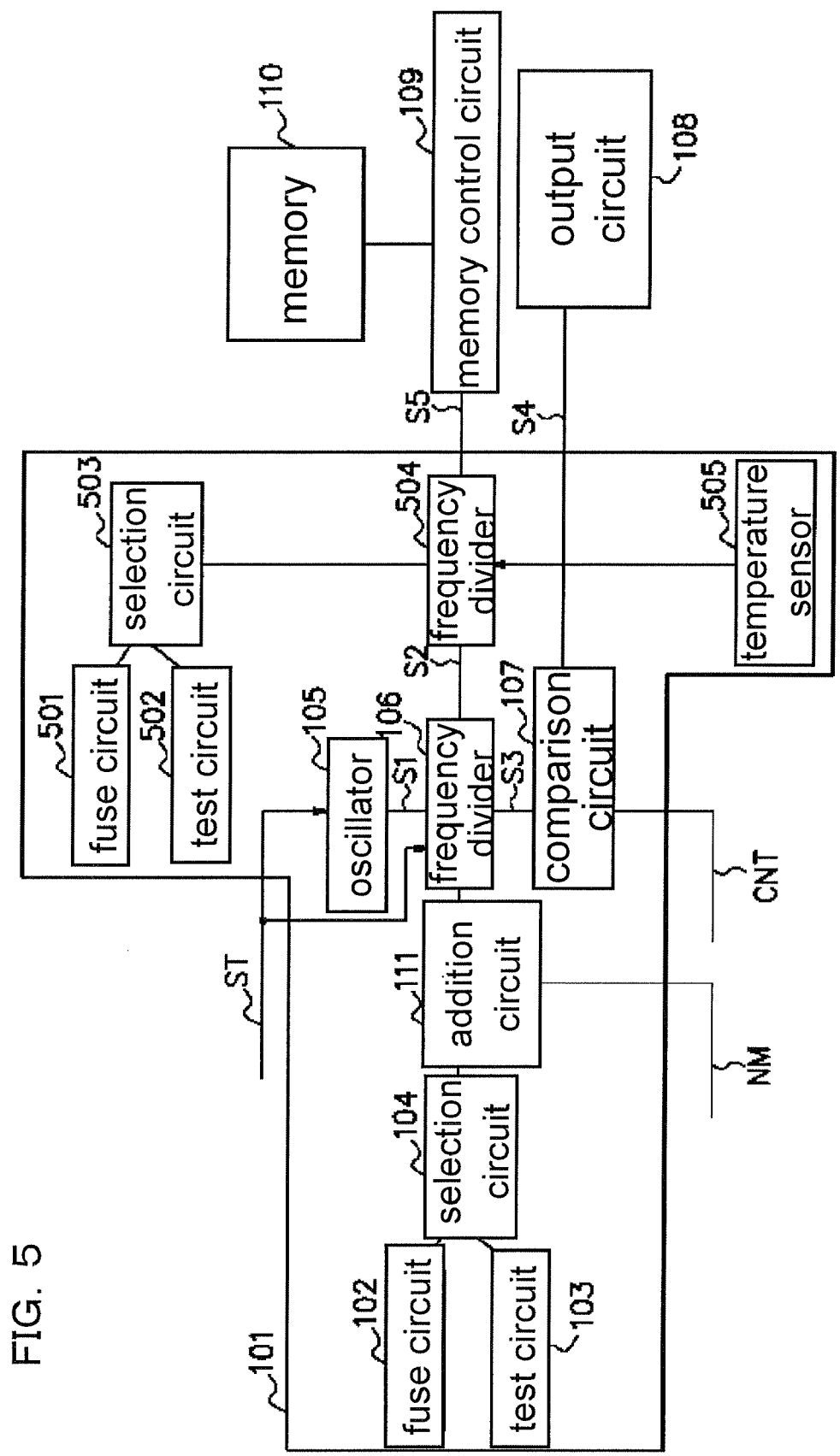
FIG. 5 is a block diagram illustrating the structure of a memory device according to a third embodiment.

FIG. 5 is a block diagram illustrating the structure of a memory device according to a third embodiment. The memory device according to the present embodiment (FIG. 5) is obtained by further providing a fuse circuit 501, a test circuit 502, a selection circuit 503, a frequency divider 504, and a temperature sensor 505 for the memory device according to the first embodiment (FIG. 1). The oscillator 105 and the frequency dividers 106 and 504 constitute an oscillating unit. The difference between the present embodiment and the first embodiment will now be described.

The fuse circuit 102, the test circuit 103, and the selection circuit 104 constitute a first setting unit for setting a frequency division number for the first frequency divider 106. The fuse circuit 501, the test circuit 502, and the selection circuit 503 constitute a second setting unit for setting a frequency division number for the second frequency divider 504.

The fuse circuit 102 and the test circuit 103 outputs a frequency division number at high temperature. In the measurement mode, the selection circuit 104 selects the frequency division number output from the test circuit 103. The frequency divider 106 counts the oscillation number of the oscillation signal S1 and outputs the count value S3. A frequency division number at high temperature is obtained on the basis of the detected count value S3 in a manner similar to the first embodiment and the obtained frequency division number is written into the fuse circuit 102.

The fuse circuit 501 and the test circuit 502 outputs a frequency division number at low temperature. A frequency division number obtained by multiplying the frequency division number written in the fuse circuit 102 by a factor is written into the fuse circuit 501. In the measurement mode, the selection circuit 503 selects the frequency division number output from the test circuit 502. In the normal mode, the selection circuit 503 selects the frequency division number output from the fuse circuit 501. The selection circuit 503 outputs the selected frequency division number to the frequency divider 504. The temperature sensor 505 detects a temperature. When the temperature detected by the temperature sensor 505 is lower than a threshold, the frequency divider 504 divides the frequency of the refresh request signal (first frequency division signal) S2 output from the first frequency divider 106 by the frequency division number output from the selection circuit 503, and then outputs a refresh request signal (second frequency division signal) S5. When the temperature detected by the temperature sensor 505 is higher than the threshold, the frequency divider 504 outputs the refresh request signal S2 as the refresh request signal S5. The frequency divider 504 outputs the refresh request signal obtained at the high temperature or that obtained at the low temperature in accordance with the detected temperature. At the high temperature, the frequency division number is low and the period of the refresh request signal S5 is short. At the low temperature, the frequency division number is high and the period of the refresh request signal S5 is long. The memory control circuit 109 performs the refresh operation on the memory 110 in response to the refresh request signal S5.

The addition circuit 111 does not perform addition in the measurement mode, the test mode for the final test, and the normal mode in the same way as the first embodiment. In the test mode for the first probing test, the addition circuit 111 adds the calculation factor NM (e.g., "2"). In the test mode for the second probing test, the addition circuit 111 adds the calculation factor NM (e.g., "1").

The frequency divider 504 may count the oscillation number of the refresh request signal S2 in a manner similar to the frequency divider 106. The comparison circuit 107 may compare the count value obtained by the frequency divider 504 with the reference value CNT and output a comparison result signal to the output circuit 108. The frequency division number at the low temperature may be obtained on the basis of the count value output from the frequency divider 504 and be written into the fuse circuit 501 in a manner similar to the first embodiment.

Figure 6:
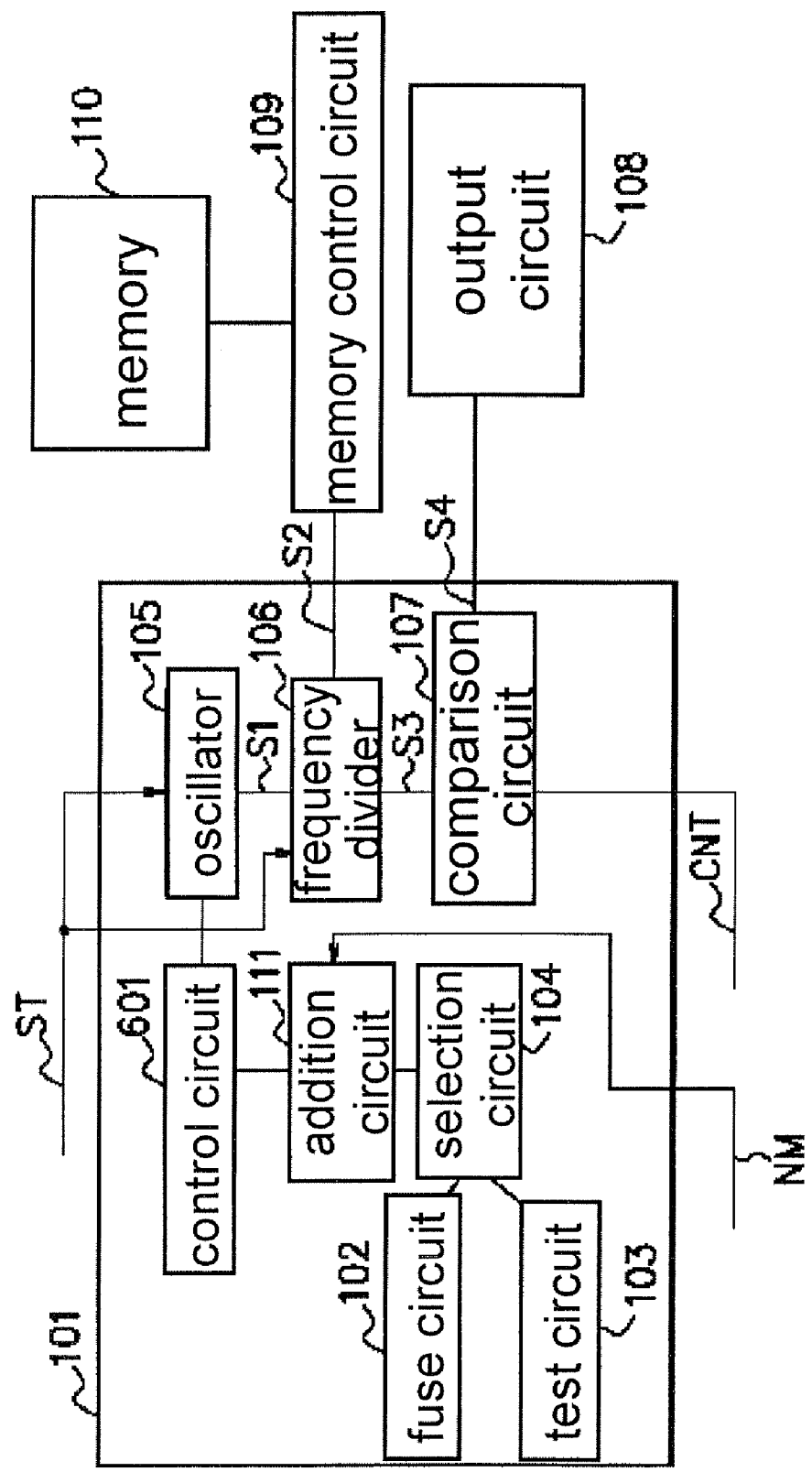
FIG. 6 is a block diagram illustrating the structure of a memory device according to a fourth embodiment.

FIG. 6 is a block diagram illustrating the structure of a memory device according to a fourth embodiment. The memory device according to the present embodiment (FIG. 6) is obtained by further providing a control circuit 601 for the memory device according to the first embodiment (FIG. 1). The difference between the present embodiment and the first embodiment will now be described. In the first embodiment, a frequency division number is controlled to adjust the period of the refresh request signal S2. According to the present embodiment, a constant current or a constant voltage is controlled to adjust the period of the refresh request signal S2.

The fuse circuit 102 and the test circuit 103 output a designation signal designating a constant current or a constant voltage to the addition circuit 111 through the selection circuit 104. The addition circuit 111 does not perform addition in the measurement mode, the test mode for the final test, and the normal mode in the same way as the first embodiment. In the test mode for each of the first and second probing tests, the addition circuit 111 adds the calculation factor NM to a value as the constant current or voltage designated by the designation signal output from the selection circuit 104.

The control circuit (controller) 601 generates a constant current or a constant voltage in accordance with the designation signal output from the addition circuit 111. The oscillator 105 generates the oscillation signal S1 at intervals according to the generated constant current or voltage. The period of the oscillation signal S1 changes depending on the constant current or voltage. The frequency divider 106 divides the frequency of the oscillation signal S1 to output the refresh request signal S2 and counts the oscillation signal S1 to output the count value S3. The other operations of the memory device are the same as those in the first embodiment.

Figure 7:
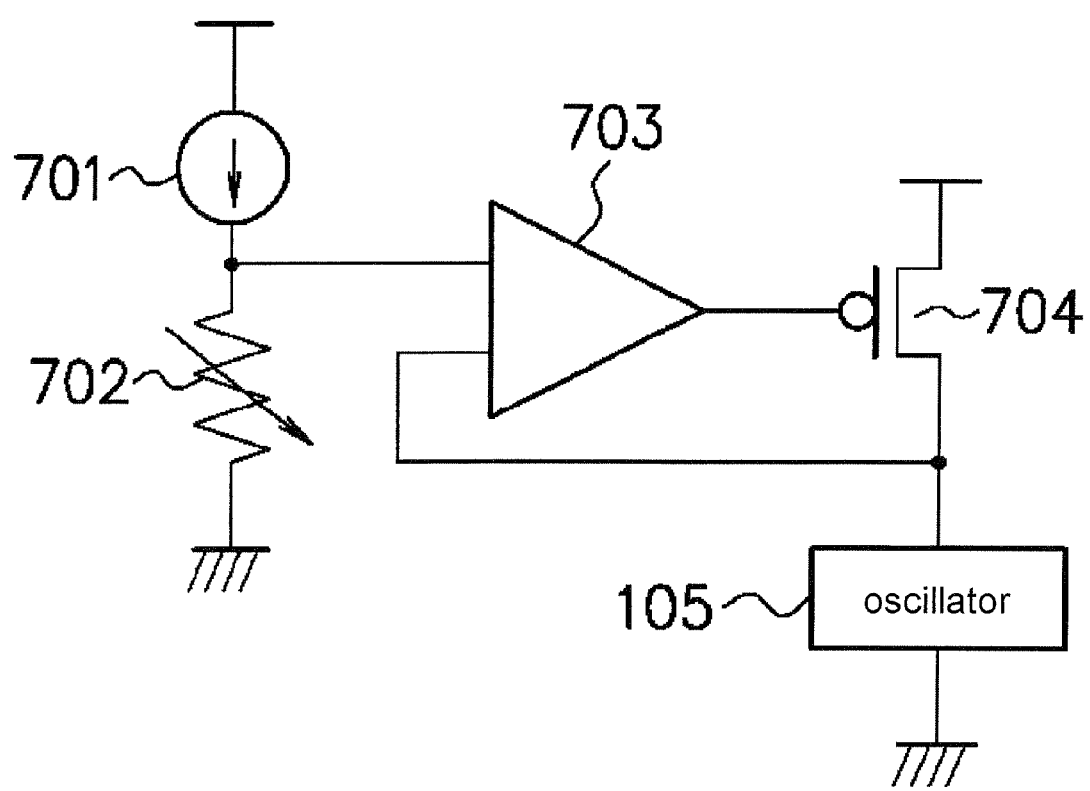
FIG. 7 is a circuit diagram illustrating a control circuit and an oscillator.

FIG. 7 is a circuit diagram illustrating the control circuit 601 and the oscillator 105. The control circuit 601 functions as a constant voltage generation circuit. A current source 701 and a variable resistor 702 are connected in series between a power supply voltage and a reference potential. A comparator 703 outputs a signal indicative of the result of comparison between a voltage across the variable resistor 702 and a voltage across the oscillator 105. The source of a p-channel MOS field-effect transistor 704 is connected to the power supply voltage, the gate thereof is connected to an output terminal of the comparator 703, and the drain thereof is connected to the oscillator 105. Changing a resistance of the variable resistor 702 can control a constant voltage supplied to the oscillator 105. The oscillator 105 generates the oscillation signal at intervals according to the constant voltage.

Figure 8:
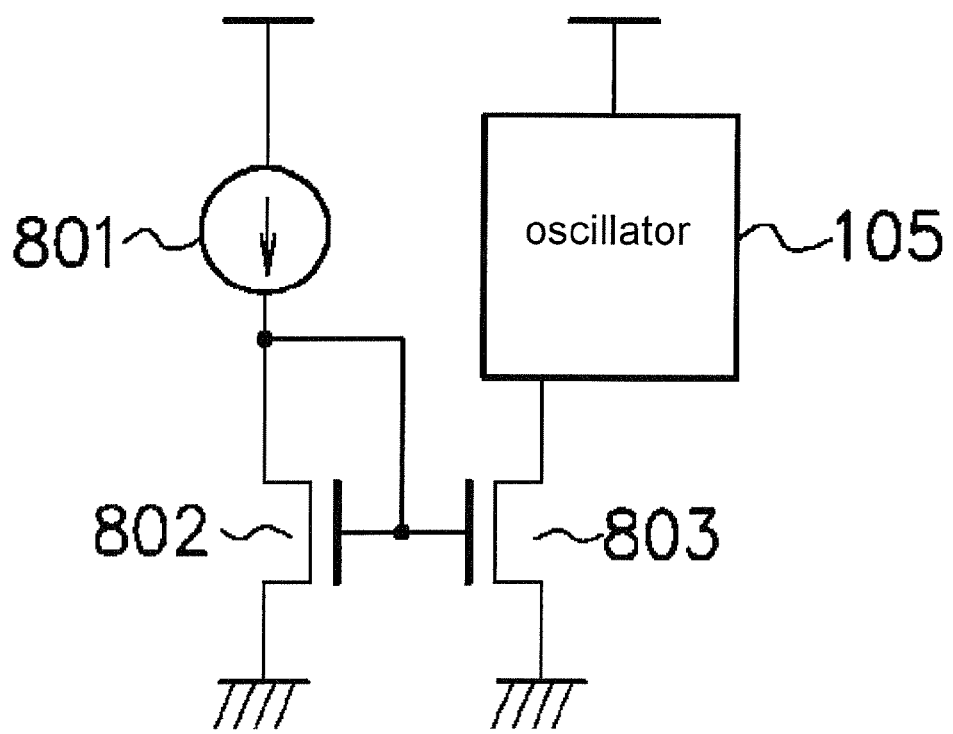
FIG. 8 is a circuit diagram illustrating another control circuit and the oscillator.

FIG. 8 is a circuit diagram illustrating another control circuit 601 and the oscillator 105. The control circuit 601 functions as a constant current generation circuit. The source of an n-channel MOS field-effect transistor 802 is connected to the reference potential and the gate and drain thereof are connected to the power supply voltage through a current source 801. The source of another n-channel MOS field-effect transistor 803 is connected to the reference potential, the gate thereof is connected to the gate of the transistor 802, and the drain thereof is connected to the power supply voltage through the oscillator 105. The channel width (gate width) of the transistor 803 is an integral multiple of that of the transistor 802 and is variable. Specifically, the transistor 803 includes a plurality of transistor elements connected in parallel. The channel width of the transistor 803 can be controlled by changing the number of transistor elements connected in parallel. Changing the channel width of the transistor 803 can control a constant current supplied to the oscillator 105. The oscillator 105 generates the oscillation signal at intervals according to the constant current.

Figure 9:
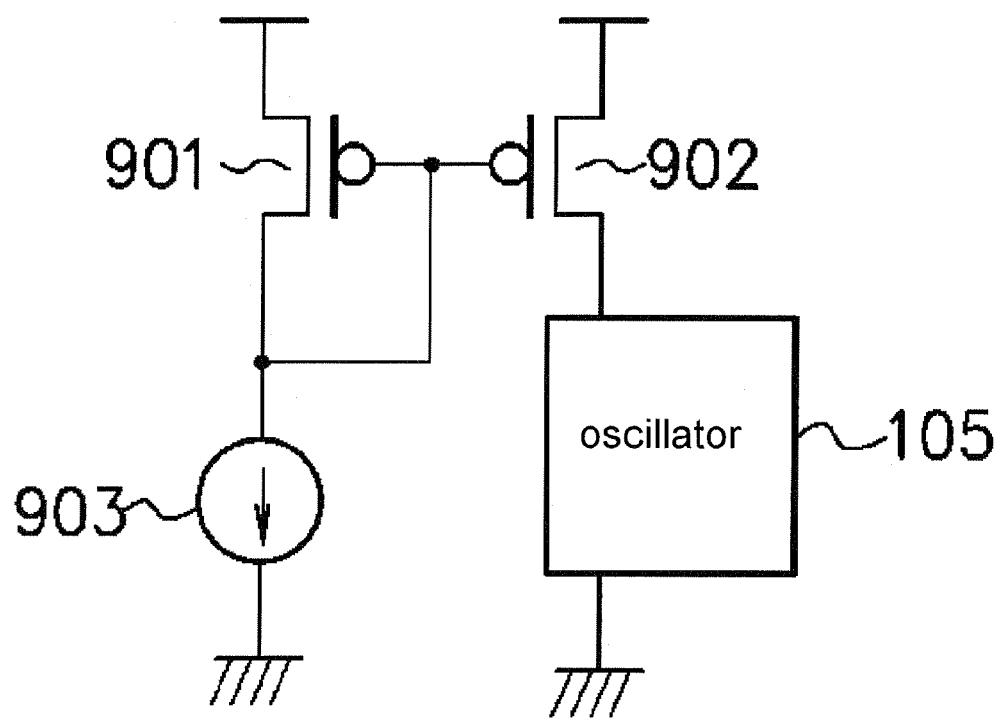
FIG. 9 is a circuit diagram illustrating another control circuit and the oscillator.

FIG. 9 is a circuit diagram illustrating another control circuit 601 and the oscillator 105. The control circuit 601 functions as a constant current generation circuit. The source of a p-channel MOS field-effect transistor 901 is connected to the power supply voltage and the gate and drain thereof are connected to the reference potential through a current source 903. The source of a p-channel MOS field-effect transistor 902 is connected to the power supply voltage, the gate thereof is connected to the gate of the transistor 901, and the drain thereof is connected to the reference potential through the oscillator 105. The channel width of the transistor 902 is an integral multiple of that of the transistor 901 and is variable. Specifically, the transistor 902 includes a plurality of transistor elements connected in parallel. The channel width of the transistor 902 can be controlled by changing the number of transistor elements connected in parallel. Changing the channel width of the transistor 902 can control a constant current supplied to the oscillator 105. The oscillator 105 generates the oscillation signal at intervals according to the constant current.

The oscillator 105 includes a plurality of inverters connected in a loop. The control circuit 601 may control the constant current or voltage and further adjust a capacitance at the node of each inverter so as to determine a delay time of each inverter in the oscillator 105, thus controlling the period of the oscillation signal S1. In this case, the fuse circuit 102 and the test circuit 103 output a capacitance designation signal.

The addition circuit 111 calculates so that the period of the oscillation signal S1 and that of the refresh request signal S2 before redundancy are longer than the period of the oscillation signal S1 and that of the refresh request signal S2 after redundancy, respectively.

According to the present embodiment, the period of the oscillation signal S1 can be measured with high accuracy in a single measurement in a manner similar to the first embodiment. Advantageously, a variation in the period of the refresh request signal S2 can be easily prevented.

Since the period of the oscillation signal S1 generated by the oscillator 105 varies due to process variations, the frequency division number stored in the fuse circuit 102 differs from semiconductor chip of a memory device to another. In the first and second probing tests, the addition circuit 111 adds the calculation factor NM, as an appropriate margin, to the frequency division number stored in the fuse circuit 102. Consequently, even when the frequency division number stored in the fuse circuit 102 differs from semiconductor chip to another, the appropriate margin can be set in the frequency division number stored in the fuse circuit 102 in each semiconductor chip. Advantageously, the first and second probing tests can be appropriately performed.

Figure 10:
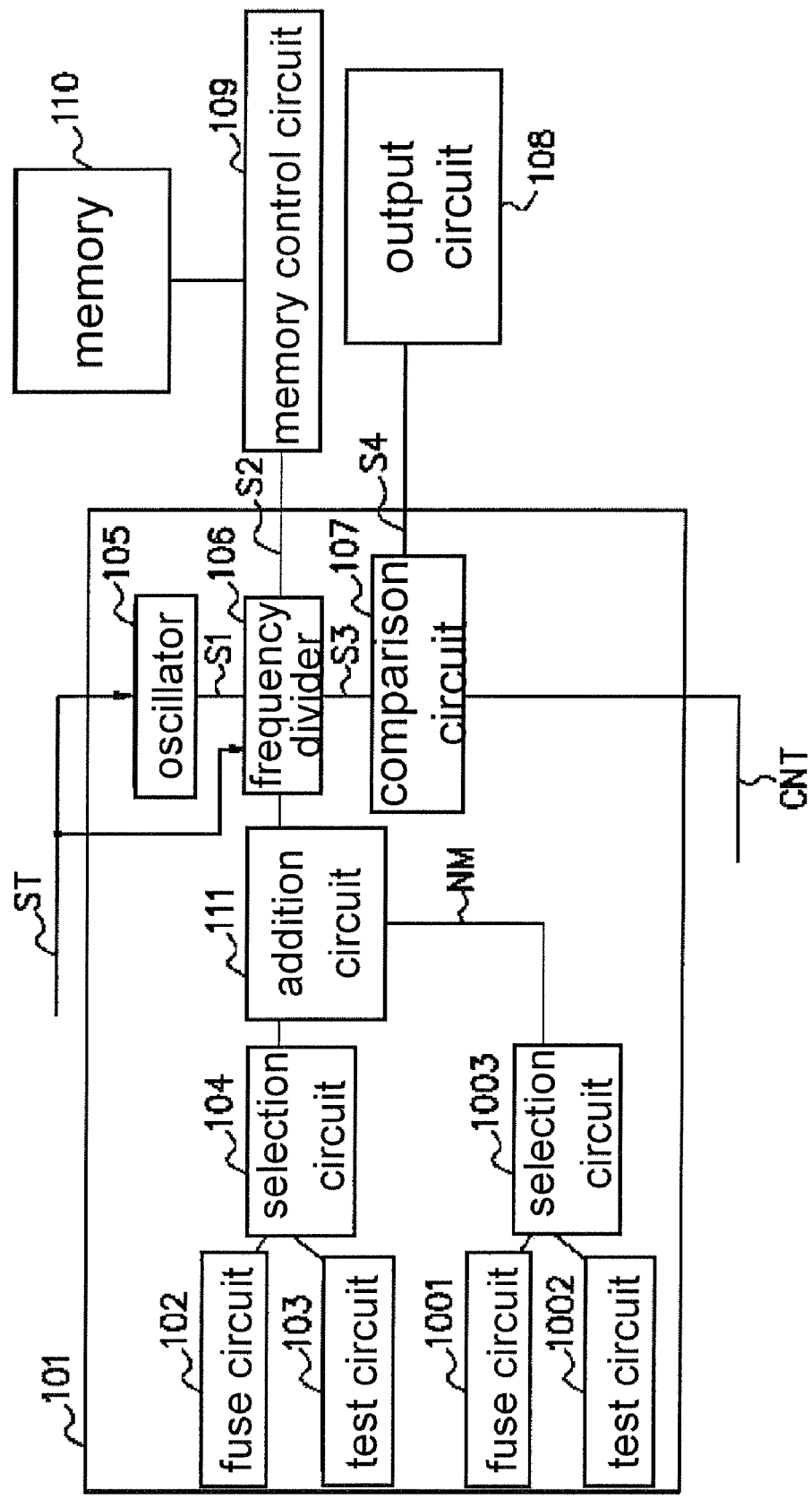
FIG. 10 is a block diagram illustrating the structure of a memory device according to a fifth embodiment.

FIG. 10 is a block diagram illustrating a memory device according to a fifth embodiment. The memory device according to the present embodiment (FIG. 10) is obtained by further providing a fuse circuit 1001, a test circuit 1002, and a selection circuit 1003 for the memory device according to the first embodiment (FIG. 1). The difference between the present embodiment and the first embodiment will now be described.

In the measurement mode and the test mode, the test circuit 1002 outputs the calculation factor NM to the addition circuit 111 through the selection circuit 1003. When the memory device passes in the test, a calculation factor of "0" is written into the fuse circuit 1001. The fuse circuit 1001, including a laser fuse circuit or an electrical fuse circuit, stores the calculation factor. In the normal mode, the fuse circuit 1001 outputs the calculation factor NM of "0" to the addition circuit 111 through the selection circuit 1003. The addition circuit 111 adds the calculation factor NM of "0" to the frequency division number output from the selection circuit 104. The other operations are the same as those in the first embodiment.

It is assumed that a memory device has failed in the second probing test or the final test in the first embodiment. In this case, the memory device may pass in the test using the refresh request signal S2 having a shorter period. In addition, the period of the refresh request signal S2 must be longer than a predetermined value or may be shorter than that depending on product specification. Therefore, a retest is made as to whether the memory device can be used as a product in which the period of the refresh request signal S2 may be shorter. When the memory device passes in the retest, the memory device is shipped as a product with relaxed specifications.

In the test mode for the retest, the test circuit 1002 outputs the calculation factor NM that is negative (for example, "−1") to the addition circuit 111 through the selection circuit 1003. The selection circuit 104 outputs the frequency division number (e.g., "20") stored in the fuse circuit 102 to the addition circuit 111. The addition circuit 111 adds the calculation factor NM (e.g., "−1") to the frequency division number (e.g., "20") in the fuse circuit 102 and outputs the low frequency division number (e.g., "19"). The frequency divider 106 divides the frequency of the oscillation signal S1 by the frequency division number output from the addition circuit 111 and outputs the refresh request signal S2 having a short period. In this state, the memory 110 is subjected to the refresh operation test. When the memory device passes in this test, the calculation factor NM (e.g., "−1") used in the above-described test is written into the fuse circuit 1001. The fuse circuit 1001 serves as a calculation factor output unit for outputting the calculation factor NM as a fixed value to the addition circuit 111.

After shipment, the memory device enters the normal mode. In the normal mode, the selection circuit 1003 selects the calculation factor written in the fuse circuit 1001 and the selection circuit 104 selects the frequency division number written in the fuse circuit 102. The addition circuit 111 adds the calculation factor NM in the fuse circuit 1001 to the frequency division number in the fuse circuit 102. The frequency divider 106 divides the frequency of the oscillation signal S1 by the resultant frequency division number output from the addition circuit 111 to generate the refresh request signal S2 having a short period.

Figure 11:
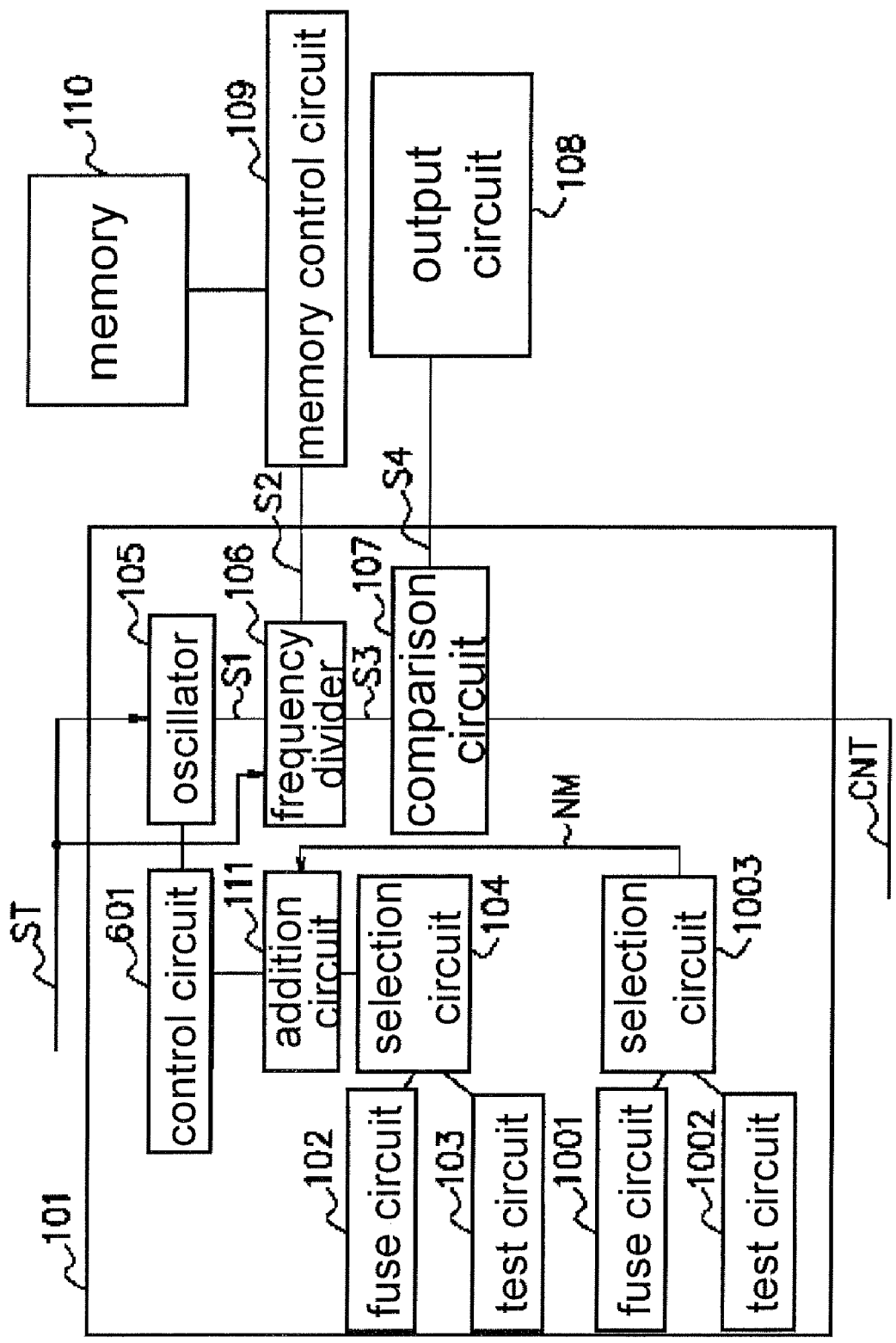
FIG. 11 is a block diagram illustrating the structure of a memory device according to a sixth embodiment.

FIG. 11 is a block diagram illustrating the structure of a memory device according to a sixth embodiment. The memory device according to the present embodiment (FIG. 11) is obtained by further providing the fuse circuit 1001, the test circuit 1002, and the selection circuit 1003 for the memory device according to the fourth embodiment (FIG. 6). The difference between the present embodiment and the fourth embodiment will now be described. The present embodiment is obtained by applying the fifth embodiment to the fourth embodiment.

In the measurement mode and the test mode, the test circuit 1002 outputs the calculation factor NM to the addition circuit 111 through the selection circuit 1003. When the memory device passes in the test, a calculation factor of "0" is written into the fuse circuit 1001. In the normal mode, the fuse circuit 1001 outputs the calculation factor NM of "0" to the addition circuit 111 through the selection circuit 1003. The addition circuit 111 adds the calculation factor NM of "0" to a value as a constant current or voltage designated by a designation signal output from the selection circuit 104. The other operations are the same as those in the fourth embodiment.

In a manner similar to the fifth embodiment, it is assumed that a memory device has failed in the second probing test or the final test. The retest is made as to whether the memory device can be used as a product in which the period of the refresh request signal S2 may be shorter. When the memory device passes in the test, the memory device is shipped as a product with relaxed specifications.

In the test mode for the retest, the test circuit 1002 outputs the calculation factor NM for reducing the period of the oscillation signal S1 to the addition circuit 111 through the selection circuit 1003. The selection circuit 104 outputs a designation signal, which designates a constant current or a constant voltage, supplied from the fuse circuit 102 to the addition circuit 111. The addition circuit 111 adds the calculation factor NM to the constant current or voltage designated by the designation signal and outputs the resultant designation signal to the control circuit 601. The control circuit 601 generates a constant current or a constant voltage on the basis of the designation signal output from the addition circuit 111. The oscillator 105 generates the oscillation signal S1 having a short period based on the generated constant current or voltage. The frequency divider 106 divides the frequency of the oscillation signal S1 to generate the refresh request signal S2 having a short period. In this state, the memory 110 is subjected to the refresh operation test. When the memory device passes in this test, the calculation factor NM used in the above-described test is written into the fuse circuit 1001. The fuse circuit 1001 serves as a calculation factor output unit for outputting the calculation factor NM as a fixed value to the addition circuit 111.

After shipment, the memory device enters the normal mode. In the normal mode, the selection circuit 1003 selects the calculation factor written in the fuse circuit 1001 and the selection circuit 104 selects the designation signal output from the fuse circuit 102. The addition circuit 111 adds the calculation factor NM in the fuse circuit 1001 to a constant current or voltage designated by the designation signal output from the fuse circuit 102. The control circuit 601 generates a constant current or voltage on the basis of the resultant designation signal output from the addition circuit 111. The oscillator 105 generates the oscillation signal S1 having a period based on the generated constant current or voltage. The frequency divider 106 divides the frequency of the oscillation signal S1 to generate the refresh request signal S2 having a short period.

In the above-described first to sixth embodiments, the case where the addition circuit 111 performs addition or subtraction has been described. A calculating unit for performing multiplication or division may be used. In this case, the calculating unit 111 performs an arithmetic operation on an oscillation period designated by an oscillation period designation signal (or a frequency division number, a constant current, or a constant voltage designated by a designation signal) output from the selection circuit 104 using the calculation factor NM. Since the arithmetic operation is performed on the oscillation period designation signal, an appropriate margin can be included in the period of the oscillation signal in consideration of a variation in the period of the oscillation signal.

The above-described embodiments are examples for embodying the present invention. It should be understood that the present invention is not limited to those embodiments and various changes and modifications of the present invention may be made without departing from the spirit and scope of the invention.

What is claimed is:

1. An oscillation device comprising:
   a first setting unit outputting a first oscillation period designation signal;
   a calculating unit performing an arithmetic operation on the first oscillation period designation signal by using a calculating factor;
   a calculation factor output unit outputting the calculation factor to the calculating unit; and
   an oscillating unit generating a first oscillation signal corresponding to a period based on the calculated first oscillation period designation signal subjected to the arithmetic operation.

2. The oscillation device according to claim 1, wherein the oscillating unit outputs the first oscillation signal for generating a refresh request signal for a memory, to an outside of the oscillation device.

3. The oscillation device according to claim 1, wherein the oscillating unit includes:
an oscillator generating a second oscillation signal; and
a first frequency divider dividing a frequency of the second oscillation signal by a frequency division number based on the calculated first oscillation period designation signal subjected to the arithmetic operation.

4. The oscillation device, comprising:
a first setting unit outputting a first oscillation period designation signal;
a calculating unit performing an arithmetic operation on the first oscillation period designation signal; and
an oscillating unit generating a first oscillation signal corresponding to a period based on the calculated first oscillation period designation signal subjected to the arithmetic operation,
wherein the oscillating unit includes:
a controller generating a current based on the calculated first oscillation period designation signal;
an oscillator generating a second oscillation signal corresponding a period based on the generated current; and
a first frequency divider dividing a frequency of the second oscillation signal.

5. The oscillation device, comprising:
a first setting unit outputting a first oscillation period designation signal;
a calculating unit performing an arithmetic operation on the first oscillation period designation signal; and
an oscillating unit generating a first oscillation signal corresponding to a period based on the calculated first oscillation period designation signal subjected to the arithmetic operation,
wherein the oscillating unit includes:
a controller generating a voltage based on the calculated first oscillation period designation signal;
an oscillator generating a second oscillation signal corresponding to a period based on the generated voltage; and
a first frequency divider dividing a frequency of the second oscillation signal.

6. The oscillation device according to claim 1,
wherein the oscillating unit includes:
a oscillation device generating a second oscillation signal by receiving a enable signal;
a first frequency divider counting a oscillation number of the second oscillation signal and generating the first oscillation signal having a frequency obtained by dividing a frequency of the second oscillation signal by a frequency division number based on the calculated first oscillation period designation signal;
a comparator comparing the counted oscillation number with a reference value,
wherein the first setting unit outputs the frequency division number of the first frequency divider as the first oscillation period designation signal according to the reference value.

7. The oscillation device according to claim 6,
wherein the reference value is set in accordance with a temperature.

8. The oscillation device according to claim 6, further comprising:
a temperature sensor detecting the temperature,
wherein the first setting unit outputs the frequency division number of the first frequency divider as the calculated first oscillation period designation signal in accordance with the detected temperature.

9. The oscillation device according to claim 1, further comprising:
a second setting unit outputting a second oscillation period designation signal,
wherein the oscillating unit includes:
a oscillation device generating a second oscillation signal;
a first frequency divider generating a third oscillation signal having a frequency obtained by dividing a frequency of the second oscillation signal by a frequency division number based on the calculated first oscillation period designation signal; and
a second frequency divider generating a forth oscillation signal having a frequency obtained by dividing a frequency of the third oscillation signal by a frequency division number based on the second oscillation period designation signal and outputting the third or forth oscillation signal according to a temperature.

10. The oscillation device according to claim 1, wherein the first setting unit includes a fuse circuit that stores the oscillation period designation signal.

11. The oscillation device, comprising:
a first setting unit outputting a first oscillation period designation signal;
a calculating unit performing an arithmetic operation on the first oscillation period designation signal; and
an oscillating unit generating a first oscillation signal corresponding to a period based on the calculated first oscillation period designation signal subjected to the arithmetic operation, wherein the calculating unit performs addition or subtraction.

12. A memory system comprising:
a first setting unit that outputs a first oscillation period designation signal;
a calculating unit that performs an arithmetic operation on the first oscillation period designation signal by using a calculating factor;
a calculation factor output unit outputting the calculation factor to the calculating unit;
an oscillating unit that generates a first oscillation signal corresponding to a period based on the calculated first oscillation period designation signal;
a memory that stores data; and
a memory controller that performs a refresh operation on the memory in response to the oscillation signal.

13. The memory system according to claim 12, wherein
the memory includes normal memory cells and redundant memory cells, and
the calculating unit performs an arithmetic operation so that the period of the oscillation signal before a normal memory cell is replaced with a redundant memory cell is longer than that after the normal memory cell is replaced with the redundant memory cell.

14. A method of oscillation for the oscillation device comprising:
outputting an oscillation period designation signal from the first setting unit;
performing an arithmetic operation on the oscillation period designation signal by using a calculation factor that is output from a calculating factor output unit; and
generating an oscillation signal corresponding to a period based on the calculated oscillation period designation signal.

15. The method of oscillation for the oscillation device according to claim 14, further comprising:
generating an oscillation signal through an oscillator; and dividing the frequency of the oscillation signal by a frequency division number based on the calculated oscillation period designation signal.

16. The method of oscillation according to claim 14, further comprising:
generating an oscillation signal corresponding to a period based on the calculated oscillation period designation signal; and
dividing the frequency of the oscillation signal.

17. A method of oscillation for the oscillation device according to claim 14, further comprising:
generating a first oscillation signal by the oscillator within a certain period;
counting a oscillation number of the first oscillation signal within the predetermined period;
storing the oscillation number;
outputting an oscillation period designation signal according to the oscillation number;
performing an arithmetic operation on the oscillation period designation signal; and
generating a second oscillation signal having a period based on the calculated oscillation period designation signal.

* * * * *